United States Patent [19]

Josephs

[11] Patent Number: 4,816,761

[45] Date of Patent: Mar. 28, 1989

[54] APPARATUS FOR MEASURING THE HYSTERESIS LOOP OF HARD MAGNETIC FILMS ON LARGE MAGNETIC RECORDING DISK

[76] Inventor: Richard M. Josephs, 220 Limestone La., Willow Grove, Pa. 19090

[21] Appl. No.: 65,293

[22] Filed: Jun. 22, 1987

[51] Int. Cl.$^4$ ............................................. G01R 33/12
[52] U.S. Cl. .................................. 324/212; 324/244; 356/369
[58] Field of Search .............................. 324/210–212, 324/213, 224, 226, 227, 237, 239, 240–243, 260, 262; 356/364, 369

[56] References Cited

U.S. PATENT DOCUMENTS

| | | | |
|---|---|---|---|
| 3,940,688 | 2/1976 | Lazzari et al. | 324/243 |
| 4,213,091 | 7/1980 | Cooper | 324/210 |
| 4,410,277 | 10/1983 | Yamamoto et al. | 356/369 X |
| 4,658,148 | 4/1987 | Naito | 324/212 X |

OTHER PUBLICATIONS

IEEE Transactions on Magnetics, vol. MAG-22 No. 5, Sep. 1986 Magneto-Optic Kerr Effect Hysteresis Loop Measurements on Particulate Recording Media by C. S. Krafft, R. M. Josephs and D. S. Crompton, pp. 662–664.

*Primary Examiner*—Reinhard J. Eisenzopf
*Assistant Examiner*—Warren S. Edmonds
*Attorney, Agent, or Firm*—John B. Sowell

[57] ABSTRACT

A magneto-optic Kerr effect hysteresis loop measuring apparatus is provided which employs a small relatively low weight ring magnet having a small gap and a high magnetic field strength in the deep gap and in the adjacent external gap. The spot on the product which is to be non-destructively tested is placed in the external gap field next to the small gap in a region of saturating magentic field. A laser beam having a high polarization ratio is directed along an incident path to the spot on the surface of the product to be non-destructively tested and the reflected beam is processed in a Kerr effect detector to provide hysteresis loop data which is capable of providing information sufficient to determine the squareness of the hysteresis loop and the coercivity of the material being non-destructively tested.

20 Claims, 5 Drawing Sheets

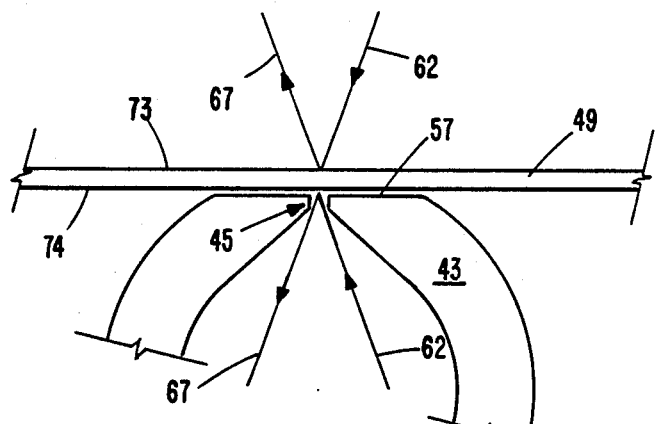
Figure 10
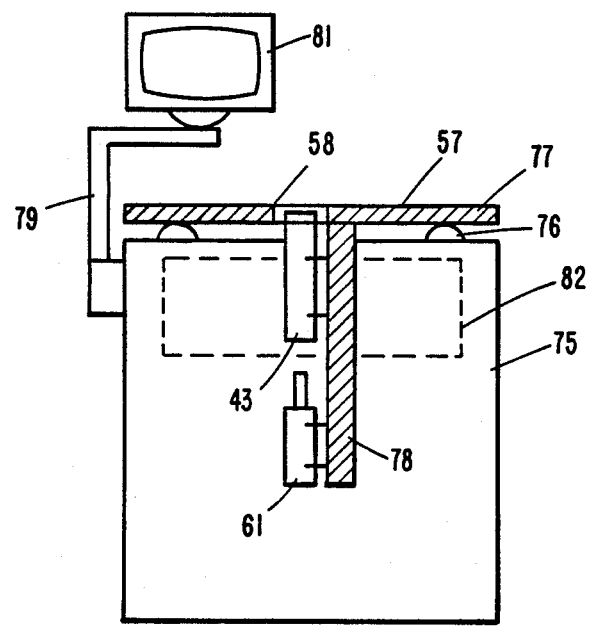
Figure 11
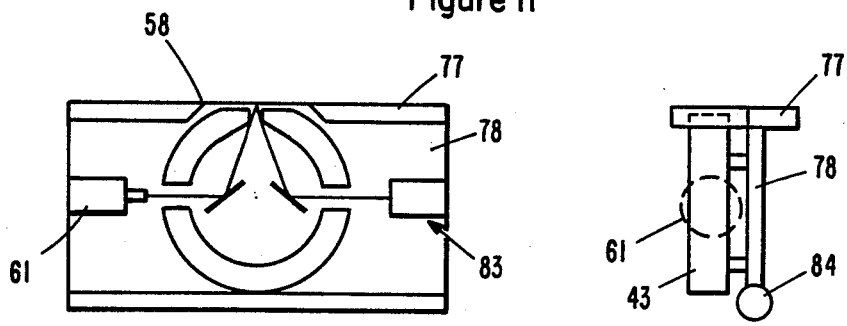
Figure 12
Figure 13

APPARATUS FOR MEASURING THE HYSTERESIS LOOP OF HARD MAGNETIC FILMS ON LARGE MAGNETIC RECORDING DISK

BACKGROUND OF THE INVENTION

1. Field of the Invention

The present invention is related to apparatus for testing the hysteresis loop characteristics of magnetic layers by employing the longitudinal magneto-optic Kerr effect. More particularly the present invention relates to a novel apparatus for non-destructively testing thin magnetic layers which are deposited on rigid or flexible substrates of arbitrary dimensions such as magnetic tape, floppy disc and hard disc for computer use as well as magnetic thin film transducers such as inductive and magneto-resistive thin films for thin film head structures. The term "non-destructively testing" as employed in this specification shall mean the product is tested without the need for cutting out samples to be measured, thus, destroying the product as required in the prior art.

2. Description of the Prior Art

Apparatus for testing the hysteresis loop of magnetic layers is known. Such apparatus are commercially available which employ inductive techniques and are commercially known as vibrating sample magnetometers or inductive hysteresis loop tracers. Such devices are well known in the art and require a large field in order to test the sample which is placed in the gap of a large electromagnet thus requiring destruction of the product from which the sample was taken.

Another form of hysteresis loop testing apparatus is known as magneto-optic Kerr effect apparatus which also requires that the sample be placed in the gap of a large electromagnetic thus requiring that the product be destroyed to create the sample. This latter type testing apparatus has been reported in IEEE TRANSACTIONS ON MAGNETICS, VOL. MAG.-22, No. 5, September 1986 at pages 662–664 entitled "Magneto-optic Kerr Effect Hysteresis Loop Measurements on Particulate Recording Media" by Dr. Richard M. Josephs, Dr. Charles S. Krafft and Douglas S. Crompton. In this reference I described the gap length as being 7.6 centimeters, which restricts the size of sample cut from a product to less than half this dimension, thus, this apparatus was incapable of testing non-destructively large products such as magnetic recording disc in the gap space or outside the deep gap.

Advances in magnetic recording technology are leading to thinner and thinner magnetic films which are currently approaching 500 angstroms (Å). Such thin magnetic films can be tested in the prior art testing apparatus mentioned above provided that samples are taken from the finished product. Quality control requires that tests be made of such critical thickness thin films on the production line during manufacture to avoid production of unacceptable product. The prior art testing techniques require extensive time to prepare the samples to be tested in the prior art devices which would permit the production line to create large amounts of scrap product before being discovered.

It would be extremely desirable to provide an economical, predictable and repeatable nondestructive hysteresis loop testing apparatus regardless of the principal employed. No such prior art testing apparatus is known or available today.

SUMMARY OF THE INVENTION

It is a principal object of the present invention to provide a nondestructive hysteresis loop testing apparatus.

It is another principal object of the present invention to provide a novel hysteresis loop measuring apparatus which indicates the squareness of the hysteresis loop and the coercivity of a finished product without any delay.

It is another principal object of the present invention to provide a novel magneto-optic Kerr effect hysteresis loop testing apparatus.

It is another object of the present invention to provide a hysteresis loop measuring apparatus which provides a controlled magnetic field of sufficient strength to substantially saturate the magnetic layer of the sample to be tested.

It is yet another object of the present invention to provide a ring shaped electromagnet having a small air gap for producing a magnetic field sufficient to saturate the magnetic layer of a sample to be tested.

It is another object of the present invention to provide a magneto-optic Kerr effect testing apparatus having a polarized laser beam which is directed incident onto a sample to be tested in the magnetic field of sufficient strength to substantially saturate the magnetic layer.

It is another object of the present invention to provide means for accurately locating the sample of a product to be nondestructively tested relative to the small gap of the ring magnet and to direct a laser beam onto the region of the magnetic layer to be tested in the region where the sample can be saturated.

It is yet another object of the present invention to measure the Kerr effect rotation of the plane of polarization of a reflected laser light beam by simple detector means.

It is yet another object of the present invention to provide a economical and simplified D.C. detection apparatus for nondestructive testing magnetic layers employing the magneto-optic Kerr effect.

According to these and other objects of the present invention there is provided a ring magnet having a closed flux path and a small gap for generating a high magnetic field strength in the deep gap and in the adjacent external gap. A sample to be tested is placed adjacent to the gap of the ring magnet so that the magnetic flux lines substantially saturate the magnetic layer to be tested. A laser beam is directed onto the saturated surface to be tested along a path which is co-planar with the direction of the magnetic field lines in the small gap and detector means are arranged in the reflected path of the laser beam for measuring the longitudinal Kerr effect and providing the magnetization and the coercivity of the spot of the product being tested without requiring destruction of the product.

BRIEF DESCRIPTION OF THE DRAWINGS

FIG. 10 is a schematic side view of the ring magnet of FIG. 3 showing yet another laser path arrangement for testing the sample with a laser beam directed externally on the surface of the sample to be tested;

FIG. 11 is a front elevation of a console model magneto-optic Kerr effect testing apparatus showing the support means for the laser and ring magnet;

FIG. 12 is a top view of another preferred embodiment support means showing an arrangement adapted to be transported in a suitcase or similar device;

FIG. 13 is a side view of the support means shown in FIG. 12; and

DESCRIPTION OF THE PREFERRED EMBODIMENTS

Figure 1:
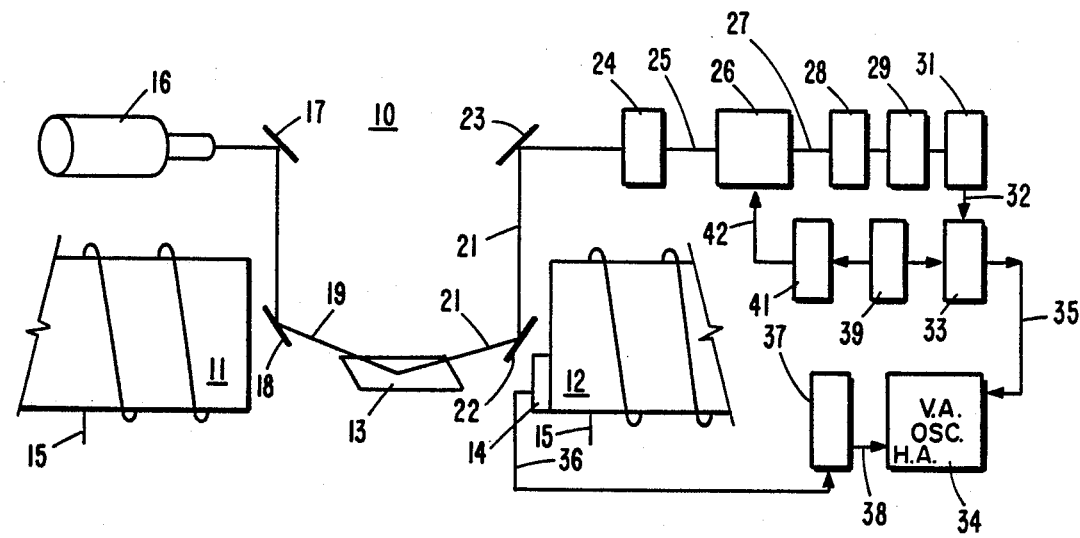
FIG. 1 is a schematic drawing of a prior art magneto-optic Kerr effect apparatus for destructively testing samples.

Refer now to FIG. 1 showing a schematic drawing of a prior art destructive sample testing apparatus 10 described in my aforementioned September 1986 IEEE article. The massive pole pieces 11 and 12 of a large electromagnet are arranged approximately 3" apart so as to provide ample room for placement of a sample 13 to be tested in the deep gap field therebetween. A Hall effect magnetic field probe 14 is also placed in the deep gap field. Windings 15 are provided on the pole pieces 11 and 12 to generate the magnetic field in the gap. A polarized laser beam is provided by laser 16 which is directed to reflecting surfaces 17 and 18 to provide an incident beam 19 which is directed in a direction which is co-planar with the magnetic field direction in the deep gap. The reflected laser beam 21 is reflected from reflecting surfaces 22 and 23 onto a Faraday rotator 24 which generates a beam 25 which has its plane of polarization rotated when applied at the input to modulator 26. The laser beam 25 has its plane of polarization modulated by the Faraday modulator 26 so as to produce a laser signal with a time varying polarization direction which can be synchronously detected. The laser beam is further processed in analyzer 28, spike filter 29 and detected at detector 31 to produce an A.C. signal on line 32 which is applied to lock-in amplifier 33 before being applied to the vertical axis of an oscilloscope or recording means 34 via line 35. The output from the Hall probe 14 on line 36 is applied to a Gaussmeter to produce a field signal on line 38 which is applied to the horizontal axis of the recorder or oscilloscope 34. The signal generator 39 provides an input reference voltage to the amplifier 33 and to the A.C. amplifier 41. The amplified A.C. signal on line 42 drives the Faraday modulator 26.

The prior art apparatus shown in FIG. 1 is described as employing field strengths up to 2,000 Oersteds but is capable of being driven to approximately 10,000 Oersteds when approximately a hundred amperes is applied to a plurality of turns 15 on a magnet which weighs approximately 1 ton. Thus, it will be understood that the prior art testing apparatus could be scaled up to provide a larger gap but would not be economically feasible or acceptable from the standpoint of size for testing products coming down an assembly line. The present invention will measure disk of any size that are transportable.

The beam from laser 16 has to be highly polarized (that is, provide a polarization ratio of at least 1,000:1) and each of the reflective surfaces 17, 18, 22 and 23 is not a perfect reflector causing an attenuation of the laser beam as well as depolarization of the laser beam which deteriorates the quality of the laser beam impinging on the sample 13.

Figure 2:
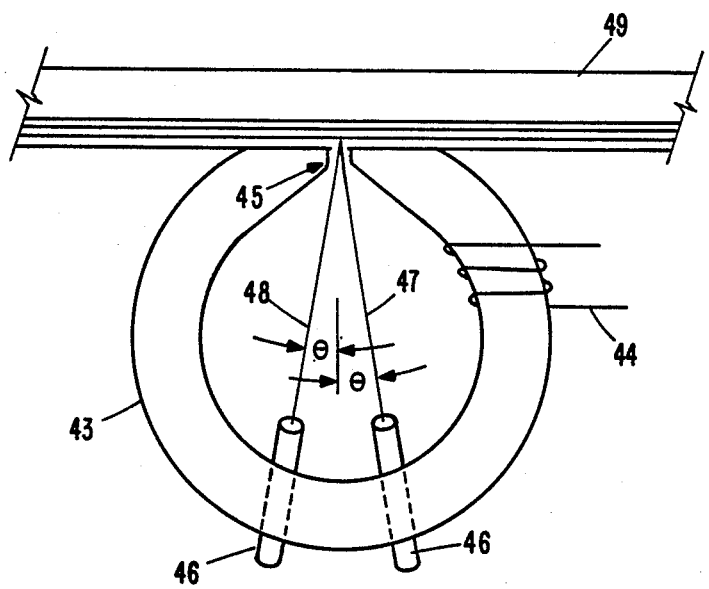
FIG. 2 is a highly simplified schematic drawing of an improved magneto-optic Kerr effect apparatus for testing by nondestructive means showing a preferred arrangement path of the incident and reflected laser beam from a sample to be nondestructively tested.

Refer now to FIG. 2 showing a side view of a preferred embodiment electromagnetic ring magnet 43 having a large number (typically about 2000) of turns 44 thereon. The ring magnet 43 is provided with a very small gap of the order of magnitude of ⅛th of 1" length and having a depth of approximately 1/16th of 1" so as to produce a magnetic field strength of up to 15,000 Oersteds in the depth of the gap 45 known as the deep gap. Such magnets have been produced which weigh less than 15 pounds and have a thickness of only ¾" to 1". Laser and detector support tubes 46 are shown inserted through the walls of the ring magnet 43 and provide a support for guiding the apparatus which produces the incident beam 47 and the reflected beam 48 which form the angle theta with the centerline of the magnet as shown. The incident laser beam 47 is shown being directed onto a spot of a product 49 to be tested. In the embodiment of FIG. 2 the product comprises a plurality of layers in which the magnetic layer of cobalt nickel is placed face down on the surface of the ring magnet so as to locate the spot being tested at the centerline of the gap 45 and also in the external gap field adjacent the deep gap field. Hard disk for computer use, such as the portion of disk 49, are known to employ cobalt nickel, nickel phosphorous layers on an aluminum magnesium substrate. Such hard disks may be removed from a moving production line and tested and placed back on the production line within a matter of less than 1 minute so as to monitor the quality of the product without destroying the product being tested or interfering with the production line. The nature of the present invention apparatus permits it to be incorporated into a continuous production line so as to produce go or no go signals or to be employed for quality control monitoring to prevent the production apparatus from exceeding the limits of acceptability.

Figure 3:
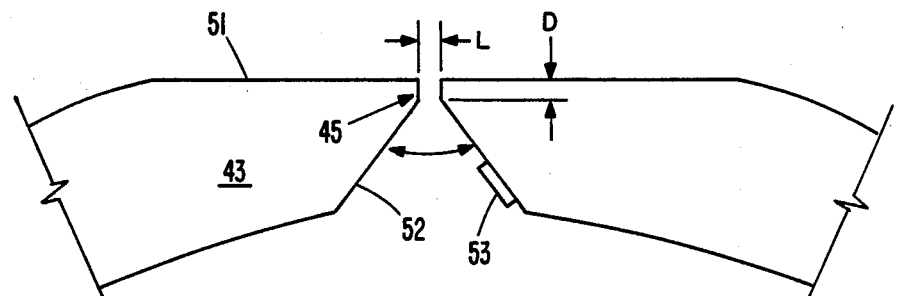
FIG. 3 is an enlarged view of the gap portion of a preferred embodiment of a ring magnet of the type shown in FIG. 2.

Refer now to FIG. 3 which is an enlarged view of the ring magnet 43 of FIG. 2 showing the length L and depth D of the gap 45. The top surface 51 is machined flat so as to provide a planar reference working surface and precise gap 45. Surface 52 is machined away at a angle sufficiently large to permit the laser beam to project completely through the gap 45 onto the surface of the aforementioned product to be tested. A Hall probe 53 is shown on one of the bottom surfaces 52 in the internal gap field as will be explained hereinafter.

Figure 4:
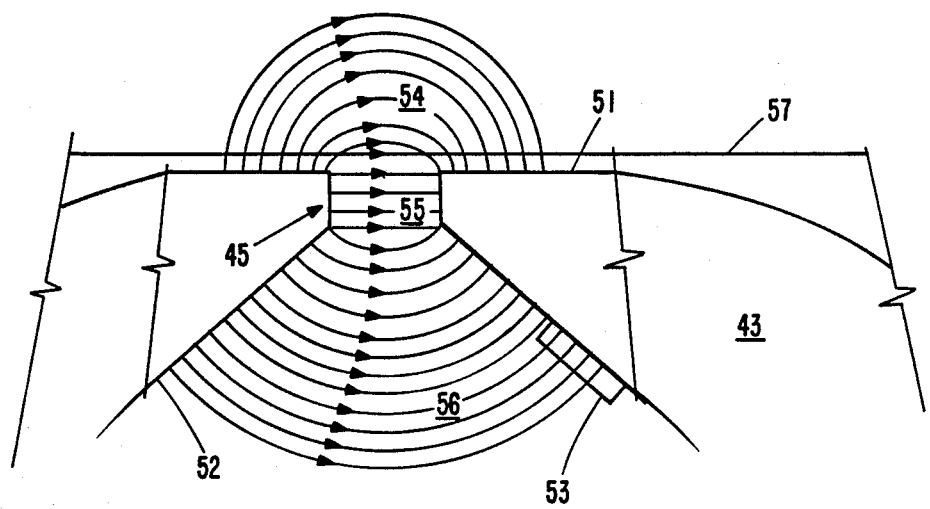
FIG. 4 is a highly enlarged view of the gap area of a preferred embodiment ring magnet of the type shown in FIG. 3 and further showing magnetic flux lines in the gap area.

Refer now to FIG. 4 which is a highly enlarged view of the gap area 45 of the electromagnet of FIG. 3 showing magnetic lines of flux in the gap area 45. The external gap field flux lines 54 are shown leaving one pole of the magnet perpendicular to the top surface 51. The deep gap field flux lines 55 are shown parallel to the top surface 51 and perpendicular to the gap edges. The internal gap field flux lines 56 are shown perpendicular to the bottom or side surfaces 52 on which the Hall probe 53 is permanently located. The surface of a table or mounting means 57 is shown positioned above the top surface 51 so as to provide a space or separation gap for clearance between the two surfaces 51 and 57 as will be explained hereinafter.

Figure 5:
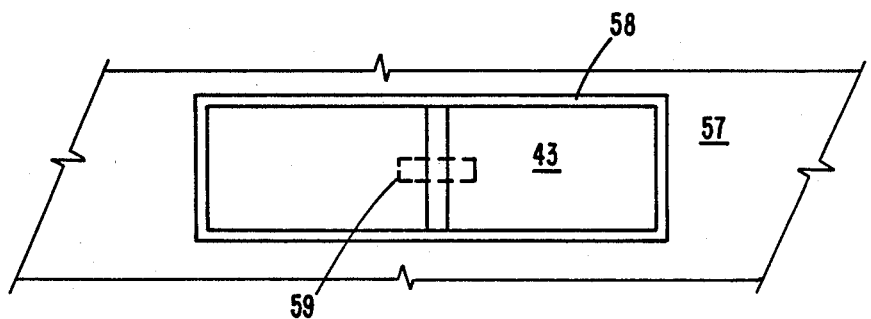
FIG. 5 is a top view of another preferred embodiment ring magnet mounted in a slot of a support table.
Figure 6:
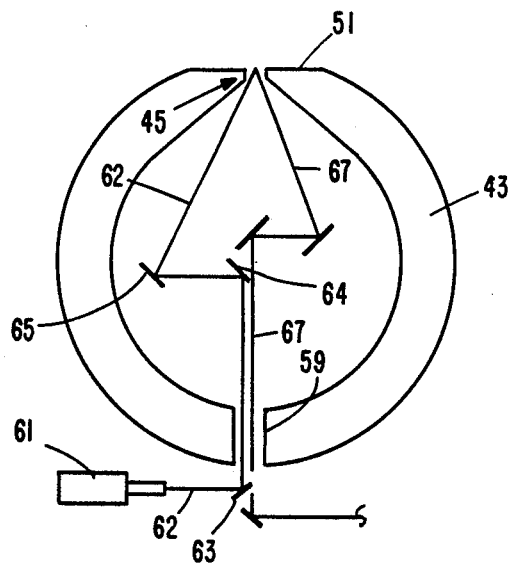
FIG. 6 is a schematic side view of the ring magnet of FIG. 5 showing a modified laser beam arrangement.

Refer now to FIG. 5 which is a top view of a preferred embodiment ring magnet 43 which is mounted in a slot 58 of the aforementioned table or support means 57. The ring magnet is preferably mounted on a fixed plate connected to the top of the table or support means 57, which has a protective coating, so as to position it accurately close to the top surface 57 as shown in FIG. 4. An aperture or slot 59 is shown in phantom lines in FIG. 5. The slot 59 is also shown in FIG. 6 which is a front view of the ring magnet of FIG. 5. A laser 61 provides a polarized laser beam 62 which is reflected from surface 63 onto second and third reflective surfaces 64 and 65 so as to provide the laser beam 62 in the gap 45 of electromagnetic ring magnet 43. It will be understood that the incident beam 62 is directed to a spot on a surface of a product to be nondestructively tested which may be placed on the top surface 51 or supported adjacent thereto on a table or support means 57 as was explained hereinbefore with regards to FIGS. 4 and 5. The magnet-to-sample separation distance is made very small to assure saturation of the spot being tested.

Figure 7:
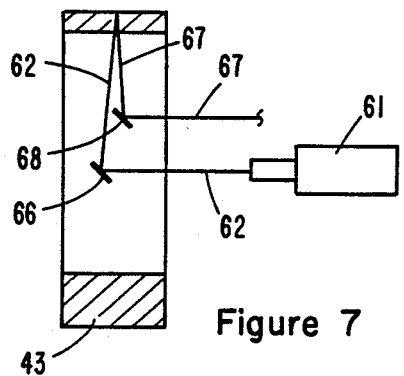
FIG. 7 is a schematic front view in partial elevation showing another laser beam path.
Figure 8:
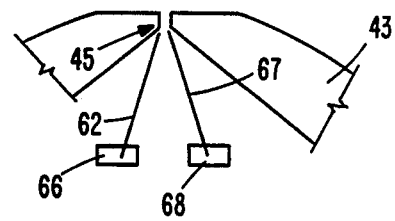
FIG. 8 is a schematic side view of the laser path arrangement of FIG. 7.

Refer now to FIG. 7 and FIG. 8 showing in front and side views another arrangement for presenting the laser beam 62 into the gap 45. The laser 61 is mounted adjacent the magnet 43 so as to reflect its beam 62 from a reflective surface 66 to provide the aforementioned incident beam 62 and a reflected beam 67 which is directed to a detector apparatus by reflective surface 68. It will be understood that the two reflective surfaces 66 and 68 occur in the same planes so that the incident beam 62 and reflected beam 67 are co-planar with the magnetic field direction 55 in the deep gap.

Figure 9:
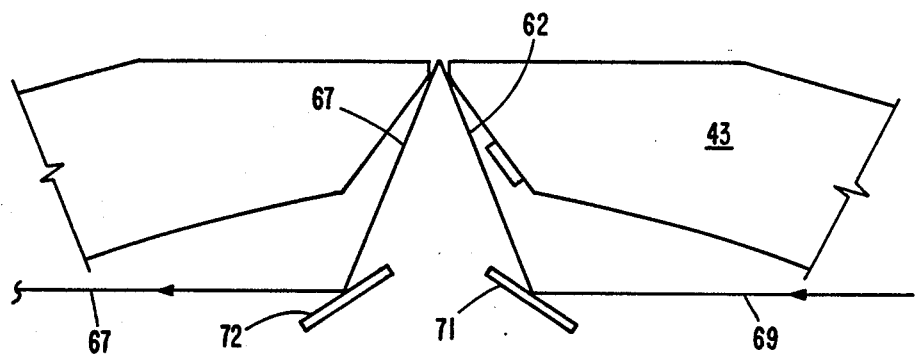
FIG. 9 is a schematic side view of the ring magnet of another laser path arrangement.

Refer now to FIG. 9 which is a side view of an enlarged ring magnet 43 showing yet another arrangement of a laser beam 69 which is directed through the side of magnet 43 and is reflected from reflective surface 71 so as to provide the aforementioned incident beam 62 and the reflected beam 67 which is reflected from a reflective surface 72 to provide the Kerr rotated reflected beam 67 which is processed in the detector apparatus to be explained hereinafter.

Refer now to FIG. 10 showing a schematic side view of a ring magnet of the type having a gap 45 of the type shown in FIGS. 3 through 9. In this arrangement, the product 49 to be tested is arranged with one of its surfaces 73 to be tested face up away from the gap 45. In this arrangement the incident beam 62 and the reflected beam 67 are provided by a laser which is mounted external to the ring magnet 43. Some forms of products such as hard disks for computer peripheral memory applications have magnetic surfaces deposited on both sides of the substrate. Thus, it is possible to combine the embodiment shown in FIG. 10 with previous embodiments and to test both sides of a hard disk 49 simultaneously without destroying the disk. For such applications it is preferred that the bottom surface 74 of the hard disk 49 be spaced apart from the top of the magnet 51 to prevent damage to the product. It will be understood that the magnetic field intensity at the two spots being tested must be calibrated separately.

Refer now to FIG. 11 showing a preferred embodiment console arrangement and a support means for the laser and ring magnet. Console 75 is provided with shock mount means 76 which support the top of the table 77 which has the aforementioned top surface 57. The ring magnet 43 is fixly mounted on the vertical support plate 78 by appropriate mounting means not shown. The gap of the ring magnet 43 is shown extending into the slot 58 so as to provide the aforementioned clearance distance below the top of the surface 57. A polarized laser 61 is also shown mounted on vertical plate 78 which is rigidly connected to the table top 77 so as to provide a mounting structure which allows the laser to be adjustably and fixly mounted relative to ring magnet 43 in a manner which is not subject to change once fixed and connected. Also shown connected to the console 75 is an adjustable arm support 79 which supports a monitor 81 which may be employed with the control means to be explained hereinafter. The control means (not shown) are mounted in console 75 and connected to the control panel 82 shown in phantom lines. Plate 78 supports laser 61 so that its incident beam 62 and reflected beam 67 is maintained in a plane perpendicular to the planar surfaces 51 and 47 and co-planar with the direction of the magnetic field in gap 45.

Refer now to FIG. 12 which is a schematic top view of another preferred embodiment showing an arrangement adapted to be transported in a suitcase or similar portable container (not shown). The ring magnet 43 is mounted on the support plate 78 and has its gap extending through slot 58 in table top 77. The laser 61 and the detector means 83 are also mounted on the plate 78 so as to provide a fixed assemblage which cannot be moved out of adjustment during hard transport use.

Refer now to FIG. 13 which is a side view of the arrangement shown in FIG. 12 showing the plate 78 and the ring magnet 43 mounted thereon. The laser 61 is also mounted on the support plate 78 and the entire assemblage is pivoted at pivot 84 so that it may be placed in operable position by pivoting the assemblage out of its carrying case and into an operating position. The monitor and control unit for a portable device of the type shown in FIGS. 12 and 13 are preferably located in a different transport case or on site equipment such as a calibrated oscilloscope or XY recorder may be provided by the customer on site.

Figure 14:
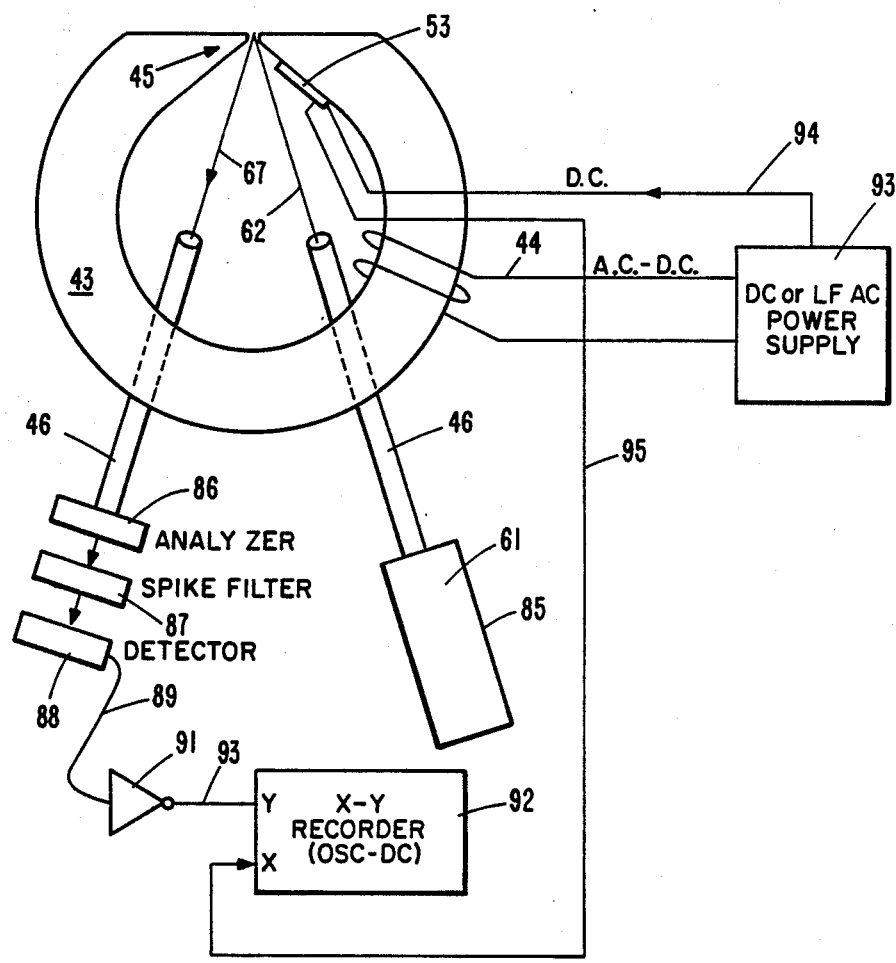
FIG. 14 is a schematic block diagram of a preferred embodiment circuit for performing magneto-optic Kerr effect measurements.

Refer now to FIG. 14 showing a schematic block diagram of a preferred embodiment circuit for performing magneto-optic Kerr effect hysteresis test. The aforementioned polarized laser 61 is mounted in an alignment tube 85 which precisely positions the laser and directs the laser beam through support tube 46 so as to provide the aforementioned incident beam 47 or 62 along the incident path directed to a spot on a product 49 (not shown) to be tested which has a surface in the external gap field. The reflected beam 48 or 67 is directed through a support tube 46 which holds the apparatus for detecting the Kerr effect rotation of the reflected beam 67. The beam 67 reflected from the sample has its plane of polarization rotated by an amount proportional to the sample magnetization. The rotated reflected beam 67 is passed through analyzer 86 and spike filter 87 and detected by the detector 88 so as to provide a D.C. signal on line 89 which is amplified at inverter amplifier 91 and applied as an analog voltage to the Y axis input of XY recorder 92. Since the analog signal on line 93 is much larger than the signal produced by the prior art devices shown in FIG. 1 it is possible to eliminate Faraday rotator 24, the modulator 26, the lock-in amplifier 33, the signal generator 39 and A.C. amplifier 41. However, it will be understood that the detector circuit shown in the prior art FIG. 1 is capable of processing the signals produced by the reflected beam 67 of the present invention. The reason for simplifying the circuitry with the present embodiment is to simplify the apparatus, reduce the cost to make it economically feasible and acceptable for commercial use. Power supply 93 is preferably a low current D.C. power supply or may be a very low frequency A.C. power supply which is applied to the turns 44 as mentioned hereinbefore to provide magnetic fields up to 8,000 Oersteds in the external gap with about 2 amperes. A D.C. output on line 94 is provided to the hall probe 53 which produces an output signal on line 95 which is applied to the X input of the XY recorder 92 or D.C. oscilloscope.

Having explained a preferred embodiment of the present invention and modifications of the arrangement of the lasers and detectors it will be understood that the present invention provides a magneto-optic Kerr effect hysteresis loop testing apparatus which permits the testing of products without damage or destruction. Accordingly, large recording disks and other hard disks for computers having extremely thin recording layers may be non-destructively tested because the Kerr effect detection of the present invention is capable of extending down to the monolayer thickness region. Multilayer magnetic layers may also be tested if the upper layer is thin enough to allow transmission of the incident and reflected beam to reach the surface to be tested. Those skilled in the testing art are capable of calibrating the circuits shown in FIGS. 1 and 14. Magnetic samples of known magnetic values have been employed to quickly set up the circuits shown.

While the present invention apparatus is not specifically designed for testing flexible media, the apparatus may be modified by those skilled in the art to nondestructive test such products. When products of the type having particulate media are tested it is preferred that the gap be filled (potted) and the incident and reflected beam be directed from a source external to the center of the ring magnet. The flux in the deep gap is so strong it can bend flexible media and collect magnetic particles.

The incident and reflected beams 62 and 67 may be directed to the spot to be tested via fiber optic cables when such polarization preserving cables are commercially available.

What is claimed is:

1. Apparatus for non-destructive hysteretic testing of magnetic layers on a product, comprising:
    ring magnet means having a closed flux path,
    a small gap less than one inch in length in said closed flux path of said ring magnet means which provides a high magnetic field strength in the deep gap field region and in the adjacent external gap field region sufficient to saturate a thin magnetic layer spot on a product to be tested.
    support means for orienting the surface of a thin magnetic layer product to be tested in a plane in said external gap outside of said deep gap,
    laser means for producing a high polarization ratio laser beam along a path which is co-planar with the direction of the magnetic field in said deep gap and the external gap region,
    said laser beam being directed along an angle of incidence to the spot on the surface of the product to be tested which is oriented perpendicular to the plane of incidence, and
    detector means arranged in the reflected incident path of said laser beam from said surface of said product to be tested for measuring the longitudinal Kerr effect and the magnetization of said magnetic layer of said spot without destroying the product being tested.

2. Apparatus as set forth in claim 1 wherein said product to be tested is placed on top of said small gap in said adjacent external gap.

3. Apparatus as set forth in claim 1 wherein said small gap is potted to prevent contamination in said small gap.

4. Apparatus as set forth in claim 2 wherein said product to be tested is oriented face up away from said small gap and said laser beam is directed to the surface of said product to be tested in a path external to said ring magnet means.

5. Apparatus as set forth in claim 1 wherein said product to be tested is placed in said external gap field face down over said small gap and said laser beam is directed to the surface of said product to be tested from inside said ring magnet means.

6. Apparatus as set forth in claim 1 which further includes product support means for supporting the surface of said product to be tested at a predetermined magnet-to-sample separation distance.

7. Apparatus as set forth in claim 6 wherein said magnet-to-sample separation distance is less than the length of said small gap.

8. Apparatus as set forth in claim 7 wherein said magnet-to-sample separation distance is between zero mils and 120 mils.

9. Apparatus as set forth in claim 5 which further includes access aperture means extending through said ring magnet means for providing a path for said laser beam.

10. Apparatus as set forth in claim 9 where said aperture means includes a plurality of independent apertures at least one for the incident laser beam and one for the reflected laser beam.

11. Apparatus as set forth in claim 5 wherein said incident laser beam is directed to the inside of said ring magnet means from a direction perpendicular to said plane of incidence.

12. Apparatus as set forth in claim 1 wherein said ring magnet means is provided with a magnetic field in excess of 5,000 Oersteds in said deep gap.

13. Apparatus as set forth in claim 12 wherein said ring magnet means comprising an electromagnet having a large number of turns and a D.C. power supply having a current less than 2 amperes.

14. Apparatus for non-destructive hysteretic testing of magnetic layers, comprising:
    ring magnet means having a closed flux path,
    a small gap less than one inch in length in said closed flux path of said ring magnet means which provides a high magnetic field strength in the deep gap field region and in the adjacent external field region of the small gap sufficient to saturate a spot on a product, support means for orienting the surface of a thin magnetic layer product to be tested in a plane in said external gap region outside of said deep gap, laser means for producing a high polarization ration laser beam along a path which is co-planar with the direction of the magnetic field in said deep gap, said support means comprising a rigid structure for supporting said magnetic layer product, said laser means and said ring magnetic means in fixed relationship relative to each other, said laser beam being directed along an angle of incidence to the spot on the surface of the product to be tested which is oriented perpendicular to the plane of incidence, and detector means arranged in the reflected incident path of said laser beam from said surface of said product to be tested for measuring the longitudinal Kerr effect and the magnetization of said magnetic layer.

15. Apparatus as set forth in claim 14 wherein said support means comprises a plurality of rigid plates for supporting said laser means and said ring magnet means in fixed relationship relative to each other.

16. Apparatus as set forth in claim 14 wherein said support means comprises a table surface having an aperture therein adapted to receive said small gap of said ring magnet means.

17. Apparatus as set forth in claim 16 wherein said small gap of said ring magnet is mounted slightly below the working level of said table surface to avoid the product touching the top of said ring magnet means.

18. Apparatus as set forth in claim 17 wherein the exposed top surface of said ring magnet means is provided with an antifriction coating to prevent damage to the surface of the product being tested.

19. A non-destructive method of testing the hysteresis loop characteristics of magnetic layers of finished products, comprising the steps of:

providing a ring magnet having a small gap less than one inch in length, a calibrated high magnet field strength in both the deep gap and the adjacent external gap regions, placing the spot of the surface of the product to be tested in said calibrated adjacent external gap field region opposite said small gap, directing a laser beam onto said spot of said surface to be tested along an incident path co-planar with the direction of the magnetic field in said deep gap, detecting the reflected laser beam from said spot of said surface of said product to be tested, and measuring the hysteresis loop using the longitudinal Kerr effect.

20. A non-destructive method of testing the hysteresis loop characteristics as set forth in claim 19 which further includes the step of calculating the coercivity and the squareness of said spot of said surface of said product to be tested as a function of said hysteresis loop.

* * * * *